United States Patent [19]

Knauer

[11] Patent Number: 5,019,712
[45] Date of Patent: May 28, 1991

[54] PRODUCTION OF FOCUSED ION CLUSTER BEAMS

[75] Inventor: Wolfgang Knauer, Malibu, Calif.

[73] Assignee: Hughes Aircraft Company, Los Angeles, Calif.

[21] Appl. No.: 363,230

[22] Filed: Jun. 8, 1989

[51] Int. Cl.⁵ .............................................. H01J 49/00
[52] U.S. Cl. ............................ 250/423 R; 250/423 F; 250/424; 250/427; 250/492.2; 250/396 R; 250/281; 250/282
[58] Field of Search ....... 250/423 R, 396 R, 396 ML, 250/424, 423 P, 423 F, 442.21, 281, 282, 283, 294, 298

[56] References Cited

U.S. PATENT DOCUMENTS

| | | | |
|---|---|---|---|
| 3,840,743 | 10/1974 | Tamura et al. | 250/396 R |
| 3,937,958 | 2/1976 | Rusth et al. | 250/396 R |
| 4,315,153 | 2/1982 | Vahrenkamp | 250/492.21 |
| 4,491,735 | 1/1985 | Smith | 250/396 R |
| 4,560,878 | 12/1985 | Knauer et al. | 250/396 R |
| 4,638,160 | 1/1982 | Slodzian et al. | 250/396 R |
| 4,687,940 | 8/1982 | Ward et al. | 250/492.21 |
| 4,737,637 | 4/1988 | Knauer | 250/281 |
| 4,755,685 | 7/1988 | Kawahami et al. | 250/396 ML |
| 4,835,399 | 5/1989 | Hosaka et al. | 250/492.2 |
| 4,853,545 | 8/1989 | Rose | 250/396 R |

Primary Examiner—Jack I. Berman
Assistant Examiner—Kiet T. Nguyen
Attorney, Agent, or Firm—Paul M. Coble; W. K. Denson-Low

[57] ABSTRACT

An ion cluster beam can be focused and delivered to a target with a selected energy range by directing the ionized beam through a beam crossover, and furnishing an energy-selecting apertured plate adjacent to the beam crossover so that the center of the beam passes through the aperture. The beam crossover is distributed along the beam axis due to the different energies of the particles in the beam. The apertured plate in the beam path removes from the beam those clusters having energies lower than and/or greater than an acceptable energy range, depending upon its placement and diameter, to provide energy selectivity. The portion of the beam passing through the aperture is imaged upon the target by a lens, and the beam may be deflected by deflector coils to write patterns across the surface of the target.

16 Claims, 3 Drawing Sheets

PRODUCTION OF FOCUSED ION CLUSTER BEAMS

BACKGROUND OF THE INVENTION

This invention relates to the production of an ion cluster beam, and, more specifically, to processing of the beam to obtain a focused beam of a selected energy distribution of the clusters.

The deposition of thin films upon substrates is an important manufacturing and research tool in a variety of fields. For example, microelectronic devices are prepared by depositing successive film layers onto a substrate to obtain specific electronic properties of the composite. Photosensitive devices such as vidicons and solar cells are manufactured by depositing films of photosensitive materials onto substrates. Optical properties of lenses are improved by depositing films onto their surfaces. These examples are, of course, only illustrative of the thousands of applications of thin film deposition techniques.

In the highly controlled approach to thin-film deposition that is characteristic of applications wherein a high quality film is required, the film is built up by a successive deposition of monolayers of atoms, each such layer being one atom thick. The mechanics of the deposition process can best be considered in atomistic terms. Generally, in such a process the surface of the substrate must be carefully cleaned, since minor contaminant masses or even contaminant atoms can significantly impede the deposition of the required highly perfect film. The material of the film is then deposited by one of many techniques developed for various applications, such as vapor deposition, sputtering, chemical vapor deposition, or electron beam evaporation.

In another technique for depositing thin films, ionized clusters of atoms are formed in a cluster source. These clusters usually have on the order of about 1000 (and sometimes up to 10,000) atoms per cluster. The clusters are ionized and then accelerated toward the substrate target by an electrical potential that imparts an energy to the cluster equal to the accelerating voltage times the ionization level of the cluster. Upon reaching the surface of the substrate target, the clusters disintegrate at impact. Each atom fragment remaining after disintegration has an energy equal to the total energy of the cluster divided by the number of atoms in the cluster. The cluster prior to disintegration therefore has a relatively high mass and energy, while each atom remaining after disintegration has a relatively low mass and energy. The energy of the atom deposited upon the surface gives it mobility on the surface, so that it can move to imperfections such as kinks or holes that might be present on the surface. Some of the deposited atoms come to rest in the imperfections, thereby removing the imperfections and increasing the perfection and density of the film. Other approaches to using clusters have been developed, and it appears that deposition using cluster beams is a promising commercial film-manufacturing technique.

As with other beam techniques, it is desirable to have the capability to focus the beam to a selected pattern, such as a well-defined spot, and to move the focused beam pattern relative to the surface of a target, to write a pre-selected pattern onto the surface of the target. Although it has been previously possible to deflect an ion cluster beam over the surface of the target, there has been little control over the cross-sectional shape of the beam.

The use of ion cluster beams presents some problems not encountered with other types of beams. Conventional beams such as electron or unclustered ion beams typically have a fairly narrow energy spectrum of the beam and a wide beam divergence. By contrast, the ion cluster beam, due to the nature of its formation and ionization, has a wide energy spectrum but fairly narrow beam divergence. That is, if one graphs the number of clusters in an ion cluster beam having a particular energy as a function of the energy, the spectrum produced is generally much broader than observed for similar types of plots for electron beams or beams of unclustered ions.

Even if the ion cluster beam could be focused to a small cross-sectional beam spot, that spot would include clusters of widely varying energies. Those various energies could have a significant adverse result on the quality of the surface deposit or effect produced with the beam. Moreover, as a practical matter, the variation in the energies of the clusters in the beam would not permit a narrowly focused beam to be produced by presently known techniques.

An important aspect of the development of commercially practical ion cluster beam apparatus and procedures is the need for an approach to producing ion cluster beams having a controllable beam cross section and a beam energy spectrum that can be selected to be within limits for particular applications. Such an approach should be compatible with other aspects of cluster beam technology. The present invention fulfills this need, and further provides related advantages.

SUMMARY OF THE INVENTION

The present invention provides an approach for producing focused ion cluster beams whose clusters all fall within a selected energy range. The apparatus of the invention can be utilized in conjunction with a beam column in which ionized cluster beams are generated, focused, and directed to a target in a well-controlled manner. The approach permits clusters outside of a well defined range, or clusters below or above particular values, to be controllably excluded from the beam, which is then focused onto the target.

The invention represents an important advance in the art of ion cluster beam apparatus. It provides focusing of the beam at a point, and control of the energy spectrum of the clusters in the beam, so that the beam is composed of a well defined collection of clusters. Other features and advantages of the invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
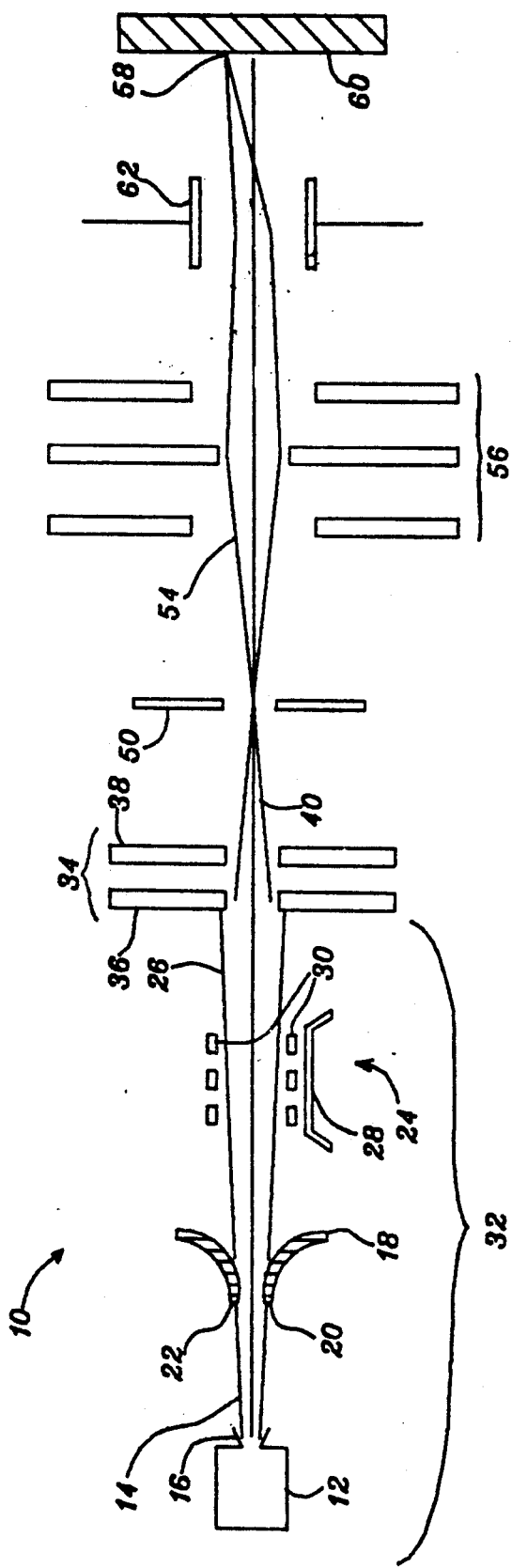
FIG. 1 is a diagrammatic side view of an apparatus for focusing and directing a cluster beam.

In accordance with the invention, apparatus for producing a focused ion cluster beam comprises means for producing a beam of ionized clusters; means for directing the ionized clusters of the beam through a beam crossover; and means for removing from the beam those clusters on the outer periphery of the beam, after the beam has been acted upon by the means for directing.

A beam of the clusters is produced by any of the several techniques known in the art, such as a furnace or a supersonic nozzle. Such devices produce clusters typically having from about 1000 to about 10,000 atoms per cluster. A characteristic of cluster sources is that most of the clusters have about the same velocity. The energy of each cluster is therefore approximately proportional to the mass of each cluster, which in turn is proportional to the number of atoms in the cluster.

The clusters are passed through an ionizer which imparts a controlled ionization state to each cluster in the beam as it passes through the ionizer. Preferably, the clusters are singly ionized, and continue along the previously established beam path.

The clusters that form the beam are accelerated by accelerator electrodes to a higher energy and velocity. The accelerator electrodes are preferably plates with openings in the centers through which the beam passes. There are typically two electrodes, the second negatively charged relative to the first, for the case of a positively charged cluster.

Passage of the beam through the accelerator plates causes the ionized clusters to be accelerated, and also causes the beam to become convergent. That is, the path of the ionized clusters is altered so that it passes though the centerline of the beam path at a point further along the path of the clusters. The location or region where the clusters pass through the centerline of the beam path, downstream of the accelerator electrodes, is termed the "crossover". The angular deflection of the ionized clusters, and thence their crossover points, is dependent upon the charge of the cluster and the initial energy of the cluster. In most cases, the clusters all carry the same charge, so that the location of the crossover for each cluster depends only upon its initial energy. The different focusing behavior of clusters of differing energies is termed "chromatic aberration". The presence of chromatic aberration is normally considered undesirable and is avoided.

However, the present invention makes use of the chromatic aberration of the beam to remove from it clusters having either too high or too low an energy and mass. An apertured plate at an electrically floating potential is placed downstream of the accelerator electrodes, preferably at or near to the crossover, with the centerline or axis of the beam passing through the aperture. The diameter of the aperture is selected so that only those clusters near the centerline of the beam can pass through the aperture. (As used herein, an "aperture" refers to an opening through a beam-blocking obstacle.)

The combination of the placement and diameter of the apertured plate serves to filter and remove clusters of energies outside the selected range. If the apertured plate is placed closer to the accelerator electrodes than the crossover, energies higher than a selected value are removed, leaving the beam with clusters of energies of that selected value or less. Conversely, if the apertured plate is placed further from the accelerator electrodes than the crossover, energies lower than a selected value are removed, leaving the beam with clusters of energies of that selected value or more. If the apertured plate is placed at the crossover, clusters of energies that are above and below a selected variation from the mean are removed, with the variation being determined by the aperture diameter. This same effect can be obtained by simultaneously placing one apertured plate closer to the accelerator electrodes than the crossover, and a second apertured plate further from the electrodes. This alternative approach is not preferred, however, because it results in reduced beam intensity.

After passing through the crossover, the beam is divergent, and can be made convergent again by a lens placed in the beam path. The lens is preferably similar to the accelerator lens, and establishes a field that deflects the ionized clusters so that they converge at a selected focal point. Since the clusters are more nearly of the same energies after the energy selection procedure, the focal point is more nearly a point, with little variation in location along the axis of the beam. A set of deflection plates can additionally be provided that establishes an electrostatic field to cause the entire beam to be deflected from side to side, permitting the beam to be written across the surface of a target located at the focal point.

The present invention is embodied in a deposition apparatus 10 illustrated in FIG. 1. The general features of such deposition apparatus 10 are described in greater detail in U.S. Pat. Nos. 4,152,478 and 4,737,637, whose disclosures are incorporated herein by reference. The deposition apparatus 10 includes a cluster source 12 which produces a cluster beam 14. The cluster beam 14 includes clusters of loosely bound atoms and unclustered single atoms, collectively termed particles herein, with the distribution of atoms and clusters determined by the construction of the source, the operating conditions, and the type of atoms being used. The velocities of the clusters and atoms are generally uniform, although the masses of the particles vary widely.

In one type of source, atoms are heated in a crucible and emitted from an opening in the top of the crucible. A fraction of the atoms naturally cluster together, but the clustering efficiency of this type of source is low. In another, preferred, type of source 12, illustrated in FIG. 1, clusters are formed by passing a pressurized gas of volatile atoms to be clustered through a sonic or supersonic nozzle 16. Clusters are formed when the gas expands and cools. The velocities of the atoms and clusters are relatively uniform upon ejection from the nozzle 16, but, as previously indicated, there is a distribution of masses of the particles.

The beam 14, which has a small divergence angle and is relatively well collimated as it leaves the nozzle 16, is passed through a skimmer 18, which has a circular opening 20 with a lip 22 facing toward the beam 12. The diameter of the opening is selected so that many gas molecules and the most divergent atoms and clusters of the beam 14 are removed from the beam.

The cluster beam 14, and the atoms and clusters therein, are not ionized when they emerge from the cluster source 12. The beam 14 is passed through an ionizer 24, wherein the clusters and some atoms are provided with an ionic charge, thereby creating an ionized beam 26. In most instances, it is preferred to ionize the particles positively, and the following description is directed to a system wherein the particles are ionized positively. The ionizer 24 is conveniently made as a cathode 28 disposed on one side of the beam 14, and an anode 30 formed of a metallic mesh surrounding the beam 14. Electrons are emitted from the cathode 28, are accelerated by the anode 30, and pass into the beam 14 where they cause ionization of a fraction of the particles, producing an ionized beam 26. Together, the source 12, the skimmer 18, and the ionizer 24 cooperate to produce the ionized beam 26 that includes clusters, and are together termed an ionized cluster source 32.

In accordance with the invention, apparatus for producing a focused ion cluster beam comprises a source of a beam of ionized clusters having a distribution of energies, the beam being directed along a beam axis; an electrode that directs the ionized clusters of the beam through a beam crossover whereat those clusters not on the beam axis pass through the beam axis; and an apertured plate through which those clusters closest to the beam axis pass, the aperture being disposed at about the location of the beam crossover. A corresponding process for producing a focused ion cluster beam comprises the steps of furnishing a beam of ionized clusters; applying a field to the beam so that the path of the clusters is directed through a crossover; and removing from the beam those clusters on the outer periphery of the beam, after the field has been applied to the beam.

Thus, the ionized beam 26 passes to an accelerator 34. In the accelerator 34, a first electrode 36 having an opening therethrough for the beam to pass is maintained at a potential less negative (for positively ionized clusters) than a second electrode 38, which also has an opening for the beam to pass through the electrode. The openings in the electrodes 36 and 38 are aligned with the beam 26, whose outer extent and shape has been previously defined by the skimmer 18. The ionized cluster beam 26 passes through aligned openings of the electrodes 36 and 38, respectively, and the particles in the beam 26 are accelerated by the potential difference, producing an accelerated beam 40. The second electrode 38 is typically about 1000 to about 20,000 volts more negative than the first electrode 36, which is permitted to float at the same voltage as the ionizer 24. As presented to the accelerator 34, the ionized beam 26 contains ionized unclustered atoms, ionized clusters, and unionized atoms and clusters. The presence of the unionized atoms and clusters is of little consequence, since these particles are not electrostatically accelerated and never become energetic. Thus, the accelerated beam 40 contains accelerated ionized atoms and clusters, and unionized, unaccelerated atoms and clusters that drift at a low velocity along the beam path.

The ionized atoms and clusters are not only accelerated by the accelerator 34, but their paths are altered, and in this respect the accelerator 34 acts as a lens. The paths of the ionized particles are deflected inwardly by an amount dependent upon their masses and energies, as generally illustrated by the ray paths of FIG. 2. The more massive and energetic particles tend to continue along a straight line, along a path indicated by numeral 42, while the less massive and energetic particles tend to be deflected through a higher angle, along a path indicated by numeral 44. Since the beam cross section is generally circular and symmetric, all of the deflected particles cross through the centerline of the beam, numeral 46, in a range termed the "crossover" 48.

If the beam were composed of particles of a single energy, then the crossover 48 would be at a single, well defined point. However, because the beam has a distribution of energies, the crossover for the more energetic particles, numeral 48a, is further from the accelerator 34 than the crossover for the less energetic particles, numeral 48b.

Because the crossovers for particles of different energies are at different points, it is essentially impossible to focus the entire beam to a well-defined spot on a target, due to the chromatic aberration. Therefore, a truncation of the energy spectrum of the beam is performed to assist in achieving a well-defined focus. The acceleration of the beam through the crossover performs a spatial sorting of the particles in the beam by masses and energies. This sorting permits selection of particular portions of the beam energy spectrum that are permitted to reach the target, by the following approach.

Selection of particular energies is accomplished by the placement of one or more apertured plates 50 in the beam 40, after the beam has been accelerated by the accelerator 34. The apertured plates are preferably, but not necessarily, placed at a position along the centerline of the beam 46 at a location adjacent the crossover 48. As used here in this context, "adjacent" means that the apertured plate 50 is placed somewhere in the range from about the crossover for the least energetic particles, 48b, to the crossover for the most energetic particles, 48a. As will be discussed, the apertured plate 50 may be placed outside this range, but its effectiveness in achieving selectivity is reduced.

Figure 3:
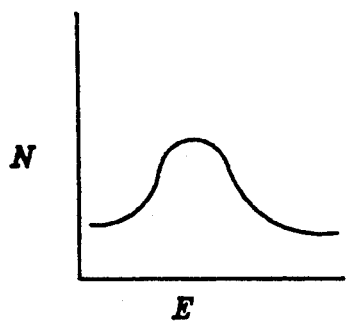
FIG. 3 is a graph of number of particles of a particular energy as a function of energy, for an accelerated beam that has not passed through an energy-selecting apertured plate.

An important objective of the use of the aperture is to alter the spectrum of particle energies (and thence masses) that reach the target. In FIG. 3, the energy spectrum of the beam 40 after acceleration in the accelerator 34, but before reaching any apertured plate 50, is indicated semiquantitatively. The spectrum has a central tendency, but has elongated tails extending to high and low energies. This spectrum results from the fact, discussed previously, that the particles produced by the source 12 have similar velocities but widely varying masses. Since energy of the particle is its mass times the square of its velocity, its energy varies approximately proportional to mass. The spectrum of FIG. 3 reflects the range of masses produced by the source.

Figure 2:
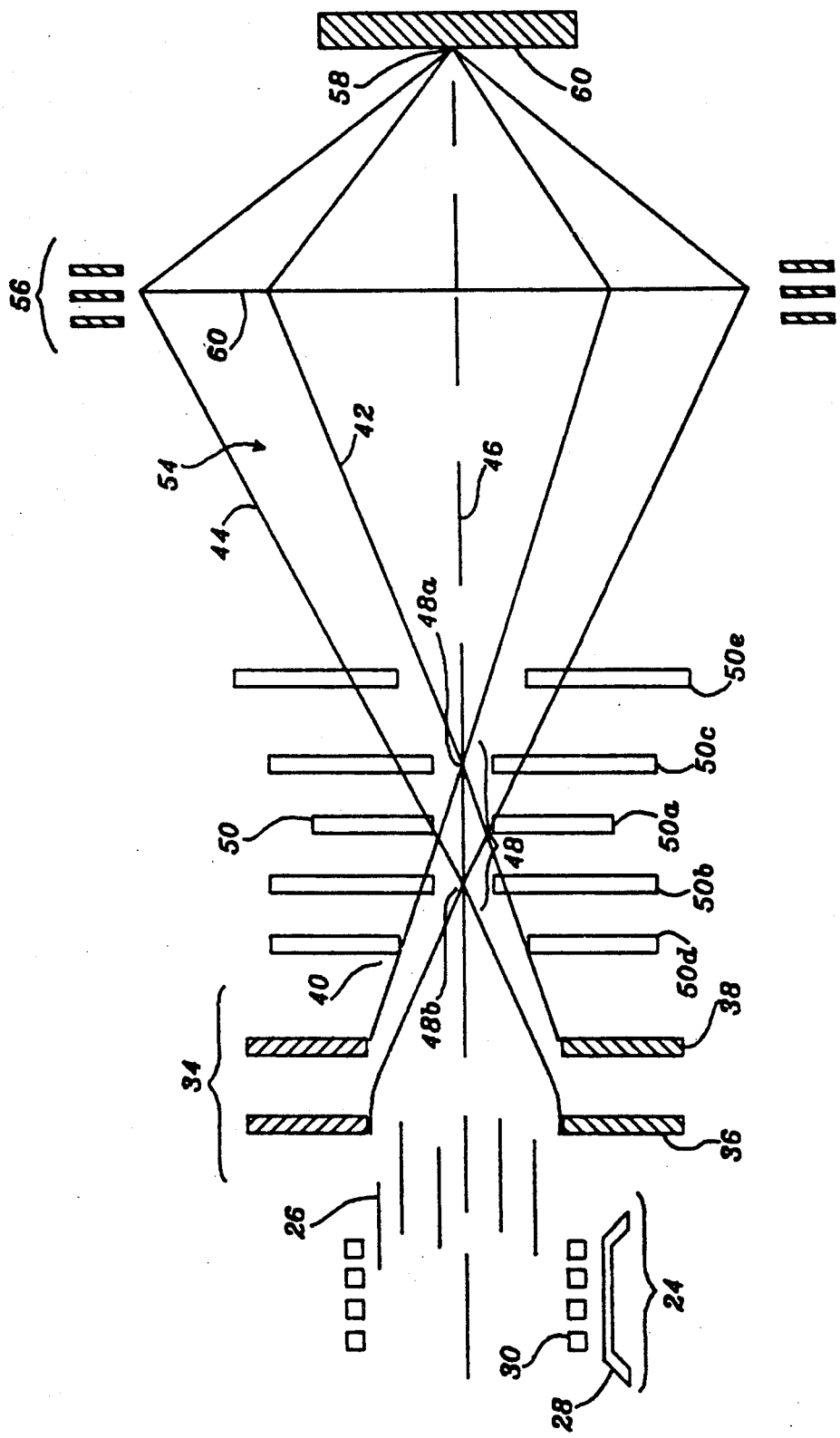
FIG. 2 is an enlarged view of a detail of FIG. 1, further illustrating the principles of focusing and energy selection.

Five cases of placement of the aperture 50 are of interest because of their effects on the energy spectrum of the beam. All five cases are illustrated in FIG. 2 by apertured plates 50a–50e, although in practice the apertured plates would be used singly or possibly in pairs, as discussed below. The resulting beam energy spectra after the beam passes through the apertures of the plates 50a–50e are illustrated in FIGS. 4A–4E, respectively.

In the first case, an apertured plate 50a is placed at about the midpoint of the crossover range 48. The aperture in the plate has a diameter smaller than the overall diameter of the beam at the crossover. The energy spectrum of the resulting beam is illustrated schematically as FIG. 4A. The total energy or intensity of the beam is generally lowered, and the high and low energy tails of the distribution are cut off by the aperture. The manner of truncation of the energy spectrum of the beam may be seen from FIG. 2. When the apertured plate 50a is near the midpoint of the crossover range 48, a portion of the low energy particles collide with the solid portion of the aperture and are removed, after the low energy particles have passed through their crossover 48b. A portion of the high energy particles are similarly removed by collision with the apertured plate 50a, but before they reach their crossover 48a.

Figure 4A:
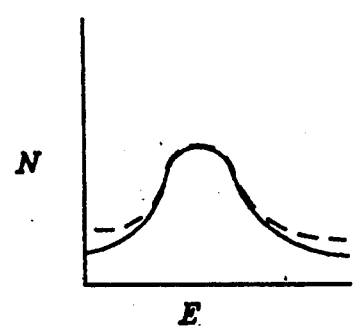
FIG. 4 is a set of five graphs FIGS. 4A–4E, illustrating the beam energy spectrum with different place-
Figure 4B:
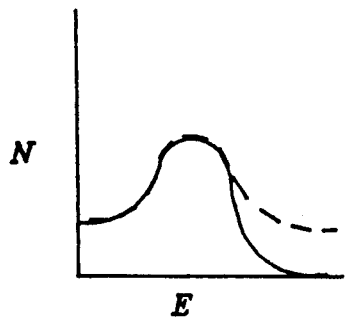

In the second case, an apertured plate 50b is placed near the crossover 48b of the less energetic particles. The less energetic particles 44 pass through the center of the aperture in the plate 50b largely without reduction in numbers, while the more energetic particles 42 are removed from the beam through collisions with the body of the plate 50b. The resulting energy spectrum, FIG. 4B, shows truncation of the high-energy portion of the spectrum.

Figure 4C:
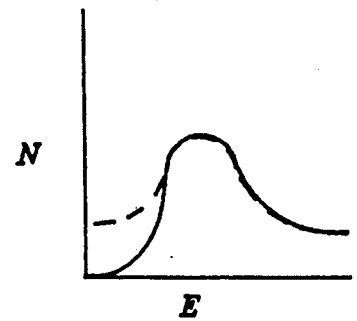

In a third case, an apertured plate 50c is placed near the crossover 48a of the more energetic particles 42, and the low energy portion of the spectrum is truncated in a manner similar to that discussed for the plate 50b, as shown in FIG. 4C.

Figure 4D:
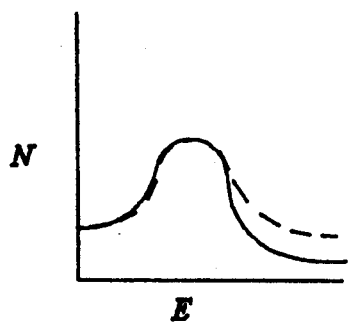

In a fourth case, the apertured plate 50d is placed between the accelerator 34 and the crossover 48b of the less energetic particles 44. In this case, a truncation similar in general respects to that achieved by the apertured plate 50b is achieved, although the truncation of the high energy portion of the energy spectrum, FIG. 4D, is less efficient but still partially effective.

Figure 4E:
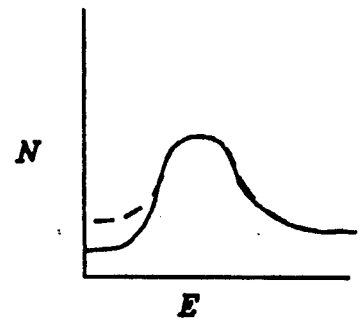

In a fifth case, an apertured plate 52e is placed further from the accelerator 34 than the crossover 48a of the more energetic particles 42. A truncation of the energy spectrum similar to that achieved by the apertured plate 50c is achieved, although the truncation of the low energy portion of the spectrum, FIG. 4E, is less efficient but still partially effective.

As may be seen from the various spectra presented in FIGS. 4A-4E, a variety of energy spectra of the beam can be achieved by placement of the apertured plate 50 at different locations. Still further selectivity can be attained by simultaneously placing more than one apertured plate in the beam at different locations along the beam centerline 46, and by using apertures of different diameters. For example, apertured plates 50b and 50c might be used simultaneously to achieve a narrowly defined spectrum. However, each additional apertured plate reduces the intensity of the beam even as it aids in achieving a narrower, better defined energy spectrum and, ultimately, a more finely focused spot size.

The preceding discussion has been presented in terms of a constant voltage for the accelerator 34, and movement of the apertured plate 50 relative to the accelerator. Alternatively, the apertured plate 50 can remain fixed, and all of the various cases discussed may be achieved by changing the accelerating voltage difference of the accelerator 34. An increase in the accelerating voltage difference causes the crossovers for all energies to be moved closer to the accelerator 34, for example, causing a relative movement with respect to a fixed aperture.

The beam of energetic particles passed through the aperture within the plate 50 is termed a conditioned beam 54, as it has been tailored to have a particular energy spectrum. The conditioned beam 54 is divergent, and can be made parallel or convergent using a lens 56 through which the beam 54 passes. The effect of the lens 56 is illustrated in FIG. 2, and is exaggerated so that the ray paths may be shown. The lens 56 is preferably at least two, and possibly more than two, apertured plates having the same general construction as the accelerator 34, and through which the beam 54 passes. If the second plate of each pair is made negative with respect to the first plate of each pair, the positively charged beam 54 will be convergently focused. In a preferred approach, the lens 56 is adjusted to cause the beam 54 to converge to form a spot 58 on a target 60, at the focal point of the beam.

A well-defined spot 58 could not be formed in the absence of the selection of a truncated energy spectrum, because of the chromatic aberration of the beam. That is, higher energy particles would be focused to one focal point, while lower energy particles would be focused to another focal point. There would be no one location that received the energy of the beam, and as a result the spot would be diffuse and unfocused.

After passing through the lens 56 and before reaching the target 60, the beam 54 can be deflected from side to side in either dimension perpendicular to the beam using a beam deflector 62, illustrated in FIG. 1. The deflector 62 in either dimension is a pair of charged plates that cause the beam passing therebetween to be deflected to one side. By changing the voltage on the deflector 62, the beam 54 can be deflected from side to side to a range of locations on the surface of the target 60. Thus, the beam can "write" patterns into the surface under control of the deflector 62.

When a singly charged cluster of 1000 atoms passes through the electrodes 36 and 38 maintained at a difference of 2000 volts, for example, an energy of 2000 electron volts is imparted to the cluster. Assuming that a cluster of this energy is passed to the target by the apertured plate 50, the high energy and high mass of the cluster permit the cluster in the beam 54 to penetrate to the surface of the target 60, even though an undesirable space charge may be present above the surface of the target. Upon impact, the cluster disintegrates, leaving each atom of the disintegrated cluster with the comparatively small energy of about 2 electron volts. The small energy per atom does not permit the atoms to penetrate the surface of the target 60 or otherwise damage the surface and the growing thin film. In fact, energies per atom on the order of about 1-10 electron volts aid in the development of a uniform structure of the film, by giving the atoms sufficient mobility on the surface to move to imperfections and eliminate them.

The apparatus 10 is normally operated within an enclosure that is evacuated by a mechanical pump and a diffusion pump to a vacuum of about $10^{-7}$ torr. The vacuum increases the mean free path of travel of the clusters in the cluster beam, and also reduces the amount of gas in the regions adjacent electrodes, to reduce the possibility of electrical discharges. The ability of the accelerator 34 to achieve high acceleration potential is limited by the pressure, because high pressures permit arcing between the electrodes 36 and 38. The skimmer 18 aids in removing gas that could cause arcing. The vacuum also reduces the possibility of undesired chemical reactions on the target 60.

The present invention provides an approach for achieving a focused beam of clusters on a target. The beam is well defined in both spatial and energy distributions, and can be used for a variety of applications requiring such a well-defined beam. Although particular embodiments of the invention have been described in detail for purposes of illustration, various modifications may be made without departing from the spirit and scope of the invention. Accordingly, the invention is not to be limited except as by the appended claims.

What is claimed is:

1. Apparatus for producing a focused ion cluster beam having clusters of substantially constant mass, comprising:
   a source of a beam of ionized clusters having a distribution of cluster masses, the beam being directed parallel to a beam axis;
   an electrode that directs the ionized clusters of the beam through a crossover whereat those clusters not previously on the beam axis pass through the beam axis, the ionized clusters passing through the beam axis over a range of distances from the electrode due to the distribution of cluster masses; and
   an apertured plate through which those clusters closest to the beam axis pass, the apertured plate being disposed at about the location of the crossover, the clusters passing through the aperture being of substantially constant mass.

2. The apparatus of claim 1, wherein the apertured plate is placed between the electrode and the location of the crossover, with the aperture along the beam axis.

3. The apparatus of claim 1, wherein the apertured plate is placed at the crossover.

4. The apparatus of claim 1, wherein the apertured plate is placed further from the electrode than the location of the crossover, with the aperture along the beam axis.

5. The apparatus of claim 1, further including
   a lens that applies a cylindrically symmetric electromagnetic field to the beam after the beam passes through the aperture.

6. The apparatus of claim 1, further including
   a deflector that applies a transverse electromagnetic field to the beam after the beam passes through the aperture.

7. Apparatus for producing a focused ion cluster beam, comprising:
   means for producing a beam of ionized clusters having a distribution of cluster masses and directed along a beam axis;
   means for directing the ionized clusters of the beam inwardly toward the beam axis and through a crossover lying on the beam axis; and
   means for removing from the beam those clusters on the outer periphery of the beam, after the beam has been acted upon by the means for directing.

8. The apparatus of claim 7, wherein the means for directing is an accelerator electrode.

9. The apparatus of claim 7, wherein the means for removing is an apertured plate placed to intercept the beam of ionized particles, such that the central portion of the beam passes through the aperture in the plate and the peripheral portion of the beam is intercepted by the plate.

10. The apparatus of claim 7, wherein the means for removing is placed between the electrode and the location of the crossover, with the aperature along the beam axis.

11. The apparatus of claim 7, wherein the means for removing is placed at the crossover.

12. The apparatus of claim 7, wherein the means for removing is placed further from the electrode than the location of the crossover, with the aperture along the beam axis.

13. The apparatus of claim 7, further including
    a lens that applies a cylindrically symmetric electromagnetic field to the beam after the beam passes through the means for removing.

14. The apparatus of claim 7, further including
    a deflector that applies a transverse electromagnetic field to the beam after the beam passes through the means for removing.

15. A process for producing a focused ion cluster beam, comprising the steps of:
    furnishing a beam of ionized clusters having a distribution of cluster masses and directed along a beam axis;
    applying a field to the beam so that the path of the clusters is directed through a crossover lying on the beam axis; and
    removing from the beam those clusters on the outer periphery of the beam, after the field has been applied to the beam.

16. The process of claim 15, wherein the step of removing is accomplished by passing the beam through an aperture of an aperture plate, wherein the diameter of the aperture is smaller than the diameter of the beam.

* * * * *